United States Patent
Sharon et al.

(10) Patent No.: US 8,315,091 B2
(45) Date of Patent: *Nov. 20, 2012

(54) DEVICE AND METHOD TO READ DATA SUBJECT TO A DISTURB CONDITION

(75) Inventors: Eran Sharon, Rishon Lezion (IL); Idan Alrod, Herzliya (IL)

(73) Assignee: Sandisk IL Ltd., Kfar Saba (IL)

( * ) Notice: Subject to any disclaimer, the term of this patent is extended or adjusted under 35 U.S.C. 154(b) by 0 days.

This patent is subject to a terminal disclaimer.

(21) Appl. No.: 13/152,001

(22) Filed: Jun. 2, 2011

(65) Prior Publication Data

US 2011/0235410 A1    Sep. 29, 2011

Related U.S. Application Data

(63) Continuation of application No. 12/363,554, filed on Jan. 30, 2009, now Pat. No. 7,995,387.

(51) Int. Cl.
  *G11C 11/34* (2006.01)
  *G11C 16/04* (2006.01)
  *G11C 16/06* (2006.01)

(52) U.S. Cl. .......... 365/185.02; 365/185.03; 365/185.09

(58) Field of Classification Search ............. 365/185.02, 365/185.03, 185.09
  See application file for complete search history.

(56) References Cited

U.S. PATENT DOCUMENTS

| | | | |
|---|---|---|---|
| 5,867,429 A | 2/1999 | Chen et al. | |
| 6,411,549 B1 | 6/2002 | Pathak et al. | |
| 7,158,414 B2 | 1/2007 | Kuo | |
| 7,196,946 B2 | 3/2007 | Chen et al. | |
| 7,436,733 B2 | 10/2008 | Mokhlesi | |
| 7,483,306 B2 | 1/2009 | Lin | |
| 7,526,715 B2 | 4/2009 | Litsyn et al. | |
| 7,533,328 B2 | 5/2009 | Alrod et al. | |
| 7,751,237 B2 | 7/2010 | Alrod et al. | |
| 7,814,401 B2 | 10/2010 | Alrod et al. | |
| 7,995,387 B2 * | 8/2011 | Sharon et al. | 365/185.02 |
| 2007/0242510 A1 | 10/2007 | Hermink | |

(Continued)

FOREIGN PATENT DOCUMENTS

WO    2007132453 A2    11/2007

(Continued)

OTHER PUBLICATIONS

Notice of Allowance and Fee(s) Due for U.S. Appl. No. 12/363,554 mailed Mar. 3, 2011, 5 pages.

(Continued)

*Primary Examiner* — Ly D Pham
(74) *Attorney, Agent, or Firm* — Toler Law Group, PC

(57) ABSTRACT

A storage device includes a plurality of memory elements and a controller. The controller is configured to receive measured characteristics of the memory elements. The measured characteristics correspond to a plurality of values including a first value stored at a first memory element of the plurality of memory elements and a second value stored at a second memory element of the plurality of memory elements. The controller is configured to test whether at least some of the plurality of values match a particular pattern correlated to a disturb condition at the first memory element. The controller is configured to provide a data value corresponding to the first memory element, where the data value is determined at least in part based on a result of the test.

20 Claims, 8 Drawing Sheets

U.S. PATENT DOCUMENTS

| | | | |
|---|---|---|---|
| 2008/0151667 A1* | 6/2008 | Miu et al. | 365/206 |
| 2008/0250300 A1 | 10/2008 | Mokhlesi et al. | |
| 2008/0263265 A1 | 10/2008 | Litsyn et al. | |
| 2009/0199074 A1 | 8/2009 | Sommer | |
| 2009/0217131 A1 | 8/2009 | Litsyn et al. | |

FOREIGN PATENT DOCUMENTS

| | | | |
|---|---|---|---|
| WO | 2008026203 | A2 | 3/2008 |

OTHER PUBLICATIONS

Notice of Allowance and Fee(s) Due for U.S. Appl. No. 12/363,554 mailed Nov. 12, 2010, 7 pages.

Restriction Requirement for U.S. Appl. No. 12/363,554 mailed Aug. 27, 2010, 6 pages.

Non-Final Office Action mailed Jul. 20, 2012 in U.S. Appl. No. 12/944,431, 7 pages.

* cited by examiner

DEVICE AND METHOD TO READ DATA SUBJECT TO A DISTURB CONDITION

REFERENCE TO EARLIER-FILED APPLICATIONS

This application is a continuation of and claims priority from U.S. patent application Ser. No. 12/363,554, filed Jan. 30, 2009, now issued as U.S. Pat. No. 7,995,387 the contents of which is hereby incorporated by reference in its entirety.

FIELD OF THE DISCLOSURE

The present disclosure is generally related to reading data that is subject to a disturb condition.

BACKGROUND

Non-volatile memory devices, such as universal serial bus (USB) flash memory devices or removable storage cards that hold data between power cycles, have allowed for increased portability of data and software applications. As process advances enable smaller physical dimensions of memory cells, physical effects such as coupling between floating gates of transistors of neighboring cells become more pronounced. Under certain circumstances, a read operation or a write operation at one memory cell may affect a charge level that is read from an adjacent memory cell.

SUMMARY

Systems and methods to read data stored on a data storage device are disclosed. The read data of a particular memory cell can be classified as having a risk of a data disturb based on comparing values of one or more neighboring memory cells to a combination of values that are correlated to a disturb condition at the particular memory cell. For example, values of the neighboring memory cells may be compared to one or more patterns that are correlated with the particular memory cell being prone to a disturb error that may be caused by a read operation or a write operation to one or more of the neighboring cells. One or more combinations of memory states of the neighboring cells that indicate the particular memory cell is prone to a disturb error may be empirically determined without determining cross-coupling coefficients between the neighboring cells and the particular memory cell.

DETAILED DESCRIPTION

Figure 1:
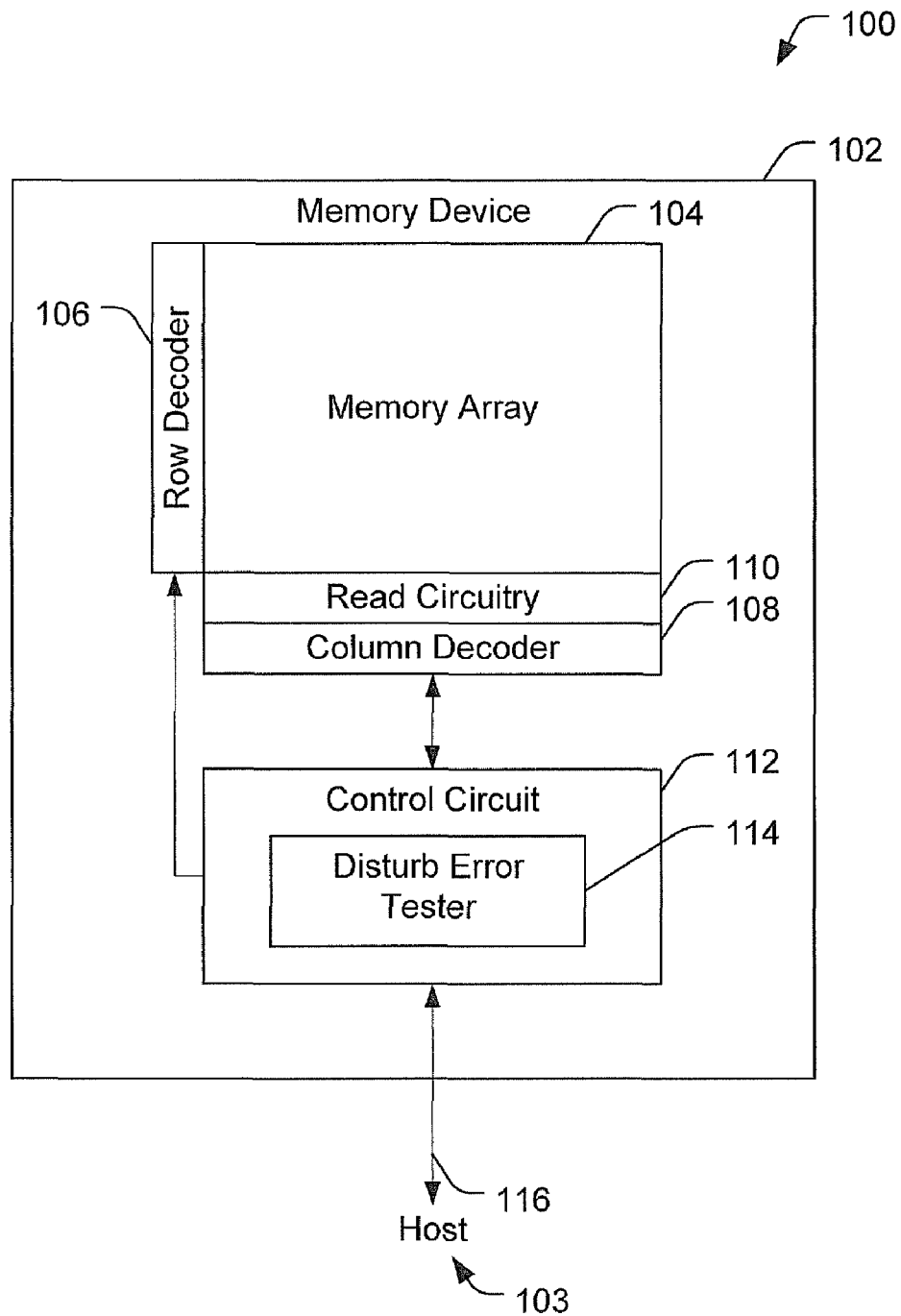
FIG. 1 is a block diagram of a particular embodiment of a system to read data that is subject to a disturb condition.

Referring to FIG. 1, a particular embodiment of a system to read data that is subject to a disturb condition is illustrated. The system 100 includes a memory device 102 in communication with a host 103 via a channel 116. The memory device 102 includes a memory array 104 coupled to a control circuit 112 that includes a disturb error tester 114. Data read from the memory array 104 in response to a data read operation is tested for a possible disturb error and corrected before being provided to a requesting device.

In a particular embodiment, the memory array 104 includes an array of memory cells that are accessible via a row decoder 106 and a column decoder 108. The row decoder 106 and the column decoder 108 are responsive to the control circuit 112. One or more addressed memory cells of the memory array 104 may be read via read circuitry 110 coupled to the memory array 104. In a particular embodiment, the memory array 104 is configured as a memory array of a flash device, such as a NAND flash device, a NOR flash device, a flash electrically erasable programmable read-only memory (EEPROM) device, or any other type of flash device.

The read circuitry 110 is configured to read a state of an addressed memory cell and to compare the state to at least one reference voltage level associated with at least two memory state ranges. For example, the memory cells may be flash cells that store charge at a floating gate of a transistor. The amount of charge stored at the floating gate affects a threshold voltage of the transistor. The threshold voltage may be compared to one or more reference voltage levels to determine whether the threshold voltage is within a first voltage range indicating a first value or a second voltage range indicating a second value. The read circuitry 110 may be programmed to compare the state of the memory cell to an appropriate number of memory state ranges. For example, in a sixteen-level flash memory, the read circuitry 110 may determine a particular state of sixteen states that corresponds to a particular memory cell.

The control circuit 112 is configured to receive memory access requests from the host 103 via the channel 116 and is coupled to the read circuitry 110 and the row and column decoders 106 and 108 to initiate read or write operations at the memory array 104. The control circuit 112 is also configured to process data read from the memory array 104. The control circuit 112 is configured to provide read data to the disturb error tester 114.

The disturb error tester 114 is configured to determine whether a particular memory cell is prone to having a disturb error based at least partially on states on other memory cells. For example, states of one or more memory cells other than a requested memory cell may also be read and provided to the disturb error tester 114 as a set of joint states to determine if the joint states are correlated to a disturb error. For example, the states of neighboring cells may be compared to one or more patterns of joint states that have been classified as being correlated to a disturb error or not correlated to a disturb error. The control circuit 112 is responsive to the disturb error tester 114 to initiate a reliability update process when the states of neighboring cells match a predetermined pattern of joint states that is classified as being correlated to a disturb error. For example, the predetermined pattern may correspond to a potential probability of a disturb error with respect to a value stored at the addressed cell.

During operation, a memory read request may be received at the control circuit 112 to read data including a value at a particular memory cell of the memory array 104. The control circuit 112 may initiate a read operation at the particular memory cell as well as at one or more neighboring memory cells. The control circuit 112 may determine which neighboring memory cells to read based on known correlations related to disturb mechanisms such as, for example, program disturb conditions, read disturb conditions, other disturb conditions, or any combination thereof.

For example, offline studies may determine correlations between the readings of certain cells and an associated set of other cells. The locations of the other cells that are correlated to program disturbs or read disturbs at the certain cells may be recorded and stored or encoded at the control circuit 112. To illustrate, the offline study may indicate that memory cells sharing a bit line with a particular cell and within four word lines of the particular cell may be sufficiently coupled to the particular cell such that a write operation may affect the state of the particular cell. Such a disturbance to the state of the particular cell due to a write operation occurring at another cell is referred to as a "program disturb," "programming disturb," and "programming-time disturb." As another illustration, the offline study may indicate that memory cells sharing a bit line with a particular cell and within four word lines of the particular cell may be sufficiently coupled to the particular cell such that a read operation may affect the state of the particular cell. Such a disturbance to the state of the particular cell due to a read operation occurring at another cell may be referred to as a "read disturb," "reading disturb," and "reading-time disturb."

In addition to potentially identifying memory cells sharing a same bitline as sufficiently coupled to the particular cell to cause a program disturb or read disturb, as another illustrative, non-limiting example, the offline study may indicate that the two nearest memory cells sharing the same word line of the particular cell, or the four diagonally adjacent cells at adjacent word lines and bit lines, or any combination thereof, may be sufficiently coupled to the particular cell to cause a program disturb or a read disturb. Memory cells that are determined to be sufficiently coupled to the particular cell and hence potentially cause a disturb condition at the particular cell as a result of a data write or read operation are referred to as "neighbor cells." Although referred to as "neighbor," such cells need not be physically adjacent to the particular cell and may instead be at any location within the memory array 104. For example, a neighbor cell may be at any location within a same block as the particular cell.

The joint states of the neighboring cells may be read by the read circuitry 110 and provided by the control circuit 112 to the disturb error tester 114. In a particular embodiment, the state of the particular cell may also be included in the joint states. The disturb error tester 114 may classify the readings of the joint states into classes, e.g. the class of readings which are in correlation with a disturb event and the class of readings which are in correlation with a non-disturb event. The control circuit 112 may modify a reliability measure of the state of the particular cell according to the classification of the reading.

In a particular embodiment, the class of readings which are in correlation with a disturb event may be determined via a lookup operation at the control circuit 112. For example, offline studies may identify patterns of joint states of neighbor cells that are correlated to a disturb event at the particular cell. Data identifying such patterns may be retrieved and compared to the joint states read in connection with the particular cell, to determine whether the state of the particular cell is prone to have been disturbed prior to the reading.

By comparing the joint states to patterns of states that are correlated to disturb events or that are correlated to non-disturb events at the particular cell, a determination may be made whether the state of the particular cell is prone to have a disturb error. Such determination may be made based on empirical observations and may be more accurate than predictions of disturbs based on models, such as models that estimate or calculate cross-coupling coefficients between adjacent cells to predict disturb events. Similarly, performing comparisons with joint state patterns correlated with disturb events or non-events may be more computationally efficient than computing determinations using physical models. Thus, improved accuracy of prediction, reduced processing requirements to generate the prediction, or both, may be achieved in comparison to systems using physical model calculations to determine disturb events.

Figure 2:
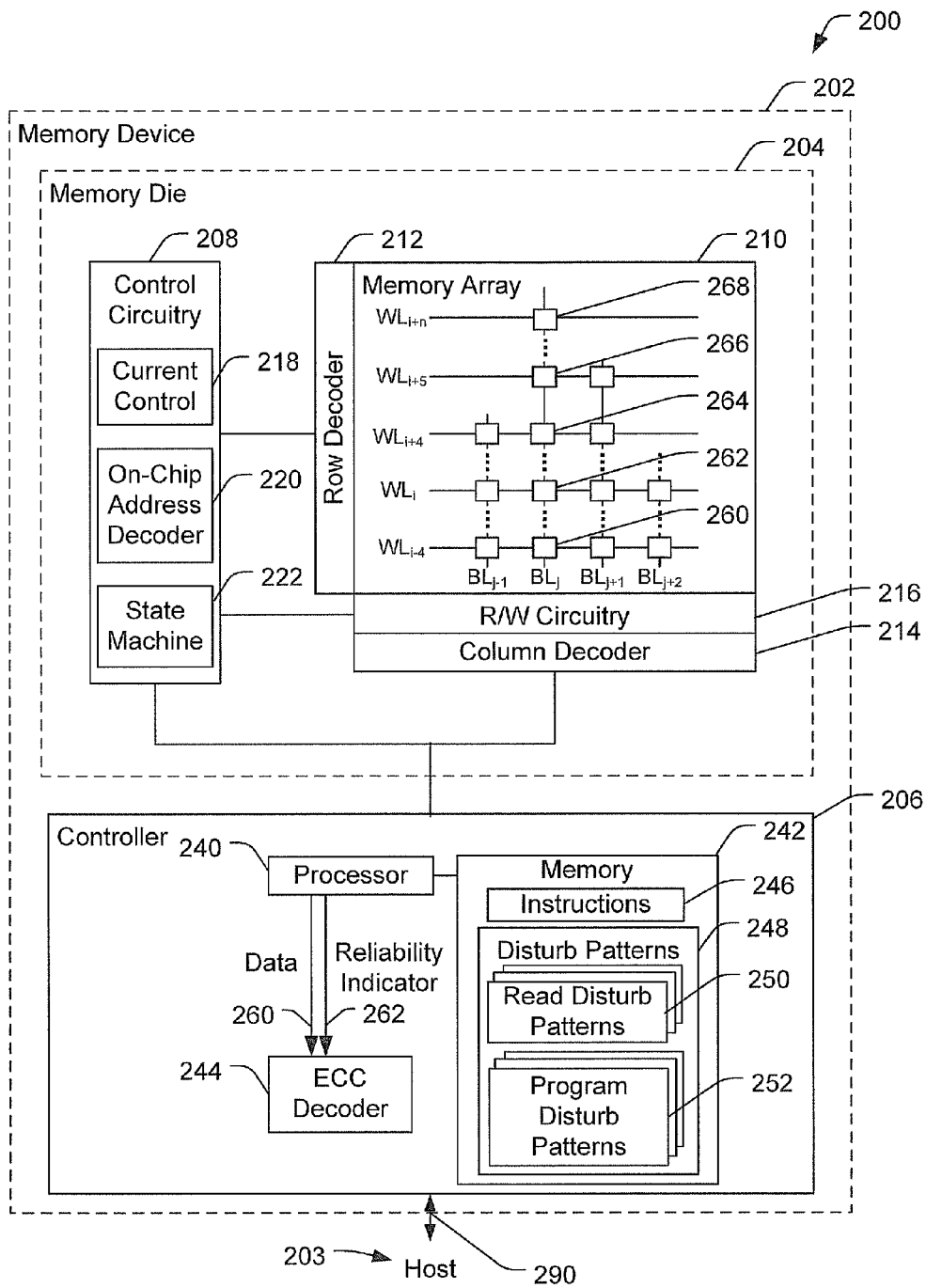
FIG. 2 is a block diagram of a second particular embodiment of a system to read data is subject to a disturb condition.

FIG. 2 is a block diagram of a second particular embodiment of a system to read data that is subject to a disturb condition. The system 200 includes a memory device 202 in communication with a host 203 via a channel 290. The memory device 202 includes a controller 206 that is coupled to one or more dies, such as a representative memory die 204. In an illustrative embodiment, the memory device 202 may be the memory device 102 of FIG. 1.

The memory die 204 includes a memory array 210, control circuitry 208, and read/write circuitry 216. The memory array 210 may be a two-dimensional array or a three-dimensional array of memory cells. The memory array 210 is addressable by word lines via a row decoder 212 and by bit lines via a column decoder 214. The read/write circuitry 216 may be operative to enable a page of memory cells to be read or programmed in parallel.

The control circuitry 208 cooperates with the read/write circuitry 216 to perform memory operations at the memory array 210. In a particular embodiment, the control circuitry 208 includes a state machine 222, an on-chip address decoder 220, and a current control module 218. The state machine 222 may provide chip-level control of memory operations. The on-chip address decoder 220 may provide an address interface between that used by the host 203 or a memory controller to the hardware address used by the decoders 212 and 214. The current control module 218 may control the current and/or voltages supplied to the word lines and bit lines during memory operations.

The memory array 210 includes representative word lines WL(i−4), WL(i), WL(i+4), WL(i+5) and WL(i+n). The memory array 210 also includes representative bit lines BL(j−1), BL(j), BL(j+1), and BL(j+2). Representative memory cells are depicted at intersections of word lines and bit lines, such as representative memory cells $M_{i-4,j}$ 260, $M_{i,j}$ 262, $M_{i+4,j}$ 264, $M_{i+5,j}$ 266, and $M_{i+n,j}$ 268 coupled to the bit line BL(j).

The controller 206 is included in the same memory device 202 (e.g., a removable storage card) as the one or more memory die 204. Commands and data may be transferred between the host 203 and the controller 206 via one or more lines of the channel 290. The controller 206 includes a processor 240 coupled to a memory 242 and also includes an error correction code (ECC) decoder 244.

In a particular embodiment, the memory 242 includes program instructions 246 that are executable by the processor 240 to receive values that are read from neighbor cells of an addressed cell and to compare the received values to one or more disturb patterns 248. The disturb patterns 248 may be stored at the memory 242 and may include one or more read disturb patterns 250. Alternatively or in addition, the disturb patterns 248 may include one or more program disturb patterns 252. For example, the disturb patterns 248 may represent combinations of one or more values of neighbor cells (and may also include values of an addressed cell) that have been determined to correlate to a disturb condition at the addressed cell.

The program instructions 246 may be executable by the processor 240 to provide data 260 to the ECC decoder 244 corresponding to a value read from the addressed cell and also to provide a reliability indicator 262 to the ECC decoder 244. The reliability indicator 262 may be at least partially based on the processor 240 determining a match between the read values and one or more of the disturb patterns 248. For example, when the read values are determined to match a disturb pattern 248 that is correlated to a disturb error at an addressed cell, the reliability indicator 262 may indicate that the data 260 is less reliable than when the read values do not match a disturb pattern 248 that is correlated to a disturb error.

In a particular embodiment, the ECC decoder 244 is configured to receive the data 260 and the reliability indicator 262 and to perform a correction operation at least partially based on the reliability indicator 262. For example, the reliability indicator 262 can include a soft error bit value corresponding to the data 260. In a particular embodiment, the reliability indicator 262 can indicate a log-likelihood ratio (LLR) for the bit.

During operation, the controller 206 may receive a data read request from the host 203 and may initiate a read operation to read a first value stored at a first memory cell and to read a second value stored at a second memory cell. For example, when the data read request includes request for data stored at $M_{i,j}$ 262, the controller 206 may also initiate reads of neighbor cells whose combination of values may be correlated to a program disturb and may be used in comparison to one or more of the program disturb patterns 252. To illustrate, the controller 206 may also read values of cells sharing the same bit line (BL(j)) as the addressed cell $M_{i,j}$ 262, such as a first value from $M_{i-4,j}$ 260 and a second value $M_{i+4,j}$ 264.

The controller 206 may be configured to compare at least the first value and the second value to a predetermined pattern, where the predetermined pattern corresponds to a potential probability of a disturb error with respect to a value stored at the addressed memory cell. For example, in a particular embodiment, the controller 206 may compare the states of the read cells $M_{i-4,j}$ 260, and $M_{i+4,j}$ 264 to one or more of the disturb patterns 248. As another example, in a particular embodiment, the controller 206 may compare the states of the read cell $M_{i-4,j}$ 260 and the addressed cell $M_{i,j}$ 262 to one or more of the disturb patterns 248. As will be discussed more with respect to FIG. 3, the predetermined pattern may represent comparisons of values to one or more thresholds. To illustrate, one or more of the disturb patterns 248 may include the second value exceeding a first threshold, the second value not exceeding a second threshold, or both. The controller 206 may provide a reliability measure to the ECC decoder 244 via the reliability indicator 262 based on whether the first value and the second value match the particular pattern. In the examples provided, the read cells are located at word lines that are non-adjacent to the addressed cell (e.g., WL(i) is separated from WL(i+4) by intervening word lines WL(i+1), WL(i+2), and WL(i+3)) and illustrate that disturb errors that are tested by comparison to the disturb patterns 248 do not include errors such as cross-coupling cancellation between adjacent cells.

Although the neighbor cells to the addressed cell $M_{i,j}$ 262 that are read and whose values are compared to the disturb patterns 248 are illustrated as the cells $M_{i-4,j}$ 260 and $M_{i+4,j}$ 264 that are coupled to the same BL(j) as the addressed cell $M_{i,j}$ 262 at non-adjacent word lines, in other embodiments the neighbor cells that are read may include any cells within the memory array 210, such as any or all of the cells 262-268 coupled to the same bit line, or cells coupled to the same word line WL(j) as the addressed cell $M_{i,j}$ 262, or cells that are coupled to adjacent word lines (not shown) and adjacent bit lines as the addressed cell $M_{i,j}$ 262, or any other cells sufficiently coupled to the addressed cell $M_{i,j}$ 262 such that a read or write operation can cause a disturb condition at the addressed cell $M_{i,j}$ 262, or any combination thereof.

In some implementations, some of the components of FIG. 2 can be combined. In various designs, one or more of the components of FIG. 2 (alone or in combination), other than the memory array 210, can be thought of as a managing circuit. For example, one or more managing circuits may include any one of or a combination of the control circuitry 208, the state machine 222, the decoders 212 and 214, the current control module 218, the read/write circuitry 216, the controller 206, any other circuit or functional element, or any combination thereof.

Figure 3:
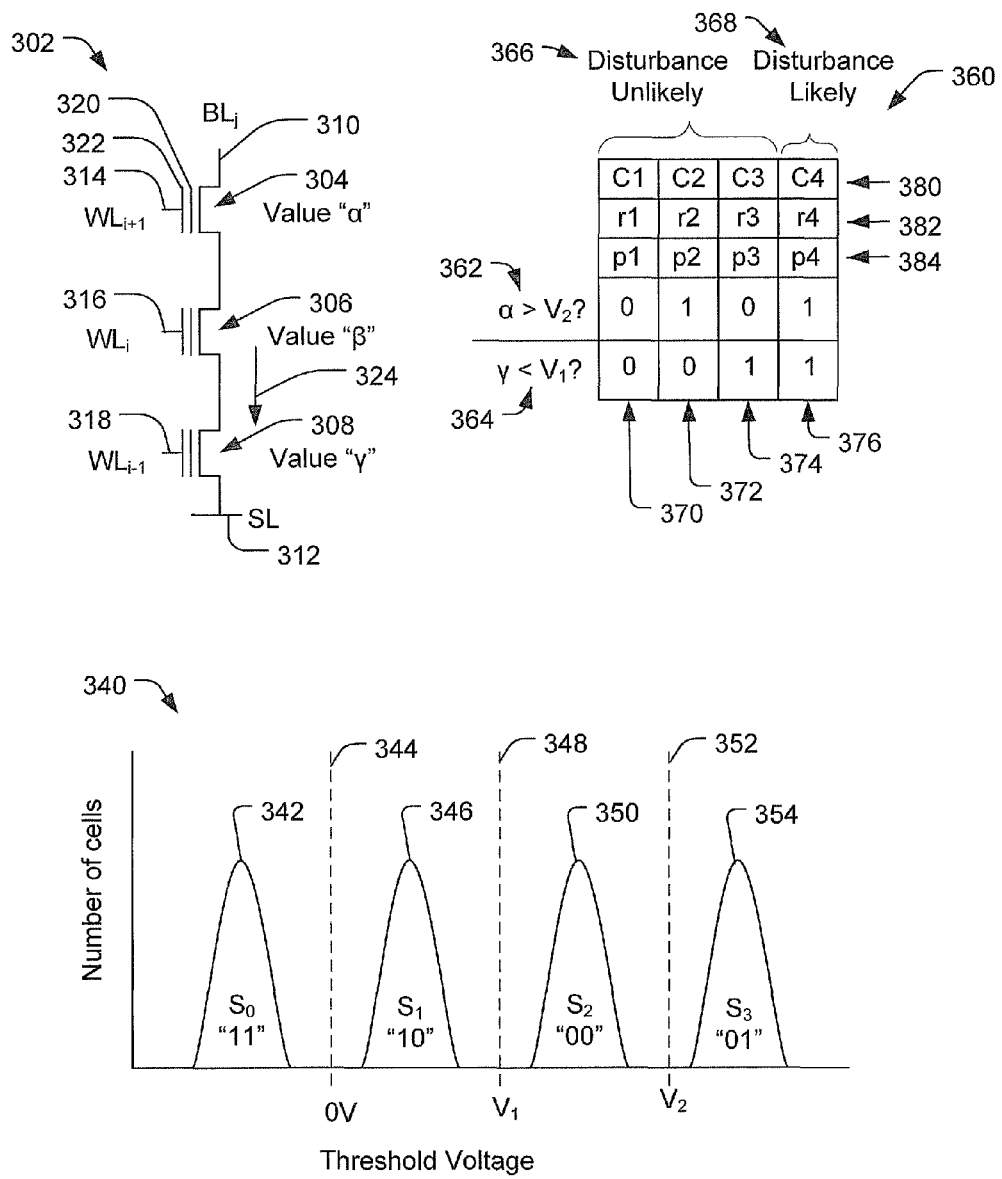
FIG. 3 is a diagram illustrating a particular embodiment of classifying whether a particular cell is prone to a disturb error.

FIG. 3 is a diagram illustrating a particular embodiment of classifying whether a particular cell is prone to a disturb error. FIG. 3 illustrates a representative NAND string 302 that includes an addressed memory cell 306, states 340 of the addressed cell 306, and a set of patterns 360 to classify the joint states of neighbor cells 304 and 308 of the addressed cell 306.

The NAND string 302 includes the cells 304, 306, and 308 coupled to a common bit line $BL_j$ 310. Each cell includes a transistor having a floating gate and a control gate, such as a floating gate 320 and a control gate 322 of the neighbor cell 304. The control gate of each of the cells 304, 306, and 308 is coupled to sequential word lines WL(i+1) 314, WL(i) 316, and WL(i−1) 318, respectively. Each of the cells 304, 306, and 308 can be independently read based on a value of a read current 324 that is responsive to voltages at the common bit line $BL_j$ 310, a source line (SL) 312, and the word line of the addressed bit cell, such as WL(i) 316. As illustrated, the cells 304, 306, and 308 have the values α, β, and γ, respectively. Although the NAND string 302 is depicted as having three transistors, in other embodiments the NAND string 302 may include more than three transistors or less than three transistors.

The states 340 of the addressed cell 306 include a first range 342 of threshold voltage values corresponding to a first state $S_0$, a second range 346 of threshold voltage values corresponding to a second state $S_1$, a third range 350 of threshold voltage values corresponding to a third state $S_2$, and a fourth range 354 of threshold voltage values corresponding to a fourth state $S_3$. The ranges 342, 346, 350, and 354 are defined by a first reference voltage level 344, illustrated as zero volts, a second reference voltage level $V_1$ 348, and a third reference voltage level $V_2$ 352. Although illustrated as four states defined by three reference voltages, in other embodiments the states 340 of the addressed cell 306 may have at least two states defined by at least one reference voltage, or at least three states defined by at least two reference voltages, or any other number of states. In addition, the states 340 also depict data values corresponding to states of the neighbor cells 304 and 308.

The states $S_0$-$S_3$ are based on a threshold voltage of the transistor of a cell, which in turn is affected by an amount of charge stored at the floating gate of the transistor. The threshold voltage may be determined based on a magnitude of the read current 324. In a particular embodiment, the first state $S_0$ is illustrated as corresponding to a "11" data value, the second state $S_1$ to a "10" data value, the third state $S_2$ to a "00" data value, and the fourth state $S_3$ to a "01" data value. However, in other embodiments, one or more of the states may correspond to a different data value.

The set of patterns 360 illustrate a particular embodiment of classifying the joint states of neighbor cells 304 and 308 of the addressed cell 306. The set of patterns 360 includes a first pattern 370, a second pattern 372, a third pattern 374, and a fourth pattern 376. The first pattern 370 may correspond to a first class C1, with a corresponding reliability measure r1 where the first pattern 370 is correlated to a probability p1 of a disturb condition at the addressed cell 306. The second pattern 372 may correspond to a second class C2, with a corresponding reliability measure r2 where the second pattern 372 is correlated to a probability p2 of a disturb condition at the addressed cell 306. The third pattern 374 may correspond to a third class C3, with corresponding reliability measure r3 where the third pattern 374 is correlated to a probability p3 of a disturb condition at the addressed cell 306. The fourth pattern 376 may correspond to a fourth class C4, with a corresponding reliability measure r4 where the forth pattern 376 is correlated to a probability p4 of a disturb condition at the addressed cell 306. The classes C1, C2, C3, and C4 may form a set of four distinct classes 380. The reliability measures r1, r2, r3, and r4 may form a set of four distinct reliability measures 382, and the probabilities p1, p2, p3, and p4 may form a set of distinct probability values 384.

In a particular embodiment, instead of each pattern 370-376 representing a distinct class C1-C4 of the set of distinct classes 380, the set of patterns 360 is classified into a first class 366 indicating that a disturbance at the addressed cell 306 is unlikely and into a second class 368 indicating that a disturbance is likely. In other embodiments, the first class 366 may indicate that a probability of a disturbance at the addressed cell 306 is below a predetermined probability and the second class 368 is at or above the predetermined probability. As illustrated, each of the probabilities p1, p2, and p3 may be less than the predetermined probability and may correspond to the first class 366 while p4 may be greater than the predetermined probability and may correspond to the second class 368. Illustrative, non-limited examples of the predetermined probability include 1%, 5%, 10%, 30%, 50%, or any other probability. In another embodiment, the first class 366 may correspond to a negligible probability of disturbance and the second class 368 may correspond to a non-negligible probability of disturbance.

The patterns 360 are illustrated as based on the values $\alpha$ and $\gamma$ of the neighbor cells 304 and 308 respectively. However, in other embodiments, one or more of the patterns 360 may be further based on the value $\beta$ of the addressed cell 306. In addition, although the patterns 360 are illustrated as based on the states of two neighbor cells, in other embodiments one or more of the patterns 360 may be based on one neighbor cell, three neighbor cells, or any other number of neighbor cells. Such neighboring cells may be any cell in the array and not necessarily a cell in near proximity to the target cell.

Determining whether the joint states associated with the values $\alpha$ and $\gamma$ match a particular pattern of the set of patterns 360 includes performing a first comparison 362 and a second comparison 364. The first comparison 362 determines whether the neighbor cell 304 has a threshold voltage greater than a first predetermined amount, such as $V_2$. The second comparison 364 determines whether the neighbor cell 308 has a threshold voltage less than a second predetermined amount, such as $V_1$. A binary value of "1" (e.g., the condition is satisfied) or "0" (e.g., the condition is not satisfied) may be determined for each comparison. The combination of binary values may be compared to the set of patterns 360 to determine which particular pattern matches the joint states.

For example, the first pattern 370 includes a binary vector<0,0> that is matched when the neighbor cell 304 has a threshold value that is greater than $V_2$, and the neighbor cell 308 has a value that is not less than $V_1$. The first pattern 370 is in the first class 366, indicating that a disturbance to the state of the addressed cell 306 is unlikely. As illustrated, only the fourth pattern 376 that includes the binary vector<1,1> is in the second class 368 that corresponds to a likely disturbance of the state of the addressed cell, where both the neighbor cell 304 has a threshold value that is greater than $V_2$ and the neighbor cell 308 has a value that is less than $V_1$. Such conditions may be empirically determined to correlate to a disturbance of the state of the addressed cell 306.

Although the set of patterns 360 is depicted as including a separate pattern to represent each possible outcome of the comparisons 362 and 364, in other embodiments the set of patterns may include additional patterns 360 that include additional or alternate comparisons. For example, the set of patterns 360 may include patterns based on a third and fourth test corresponding to states of neighbor cells coupled to word line WL(i) 316 at adjacent bit lines. Any other combination of comparisons of states of any number of neighbor cells that are determined to correlate to a disturb condition at a particular cell, or determined to not correlate to a disturb condition at the particular cell, may be included in the set of patterns 360. In addition, in other embodiments the set of patterns 360 may include only patterns correlating to a disturb condition for comparison purposes. In such embodiments, a match of any pattern would indicate a disturb condition, while a failure to match any pattern would indicate a non-disturb condition.

Figure 4:
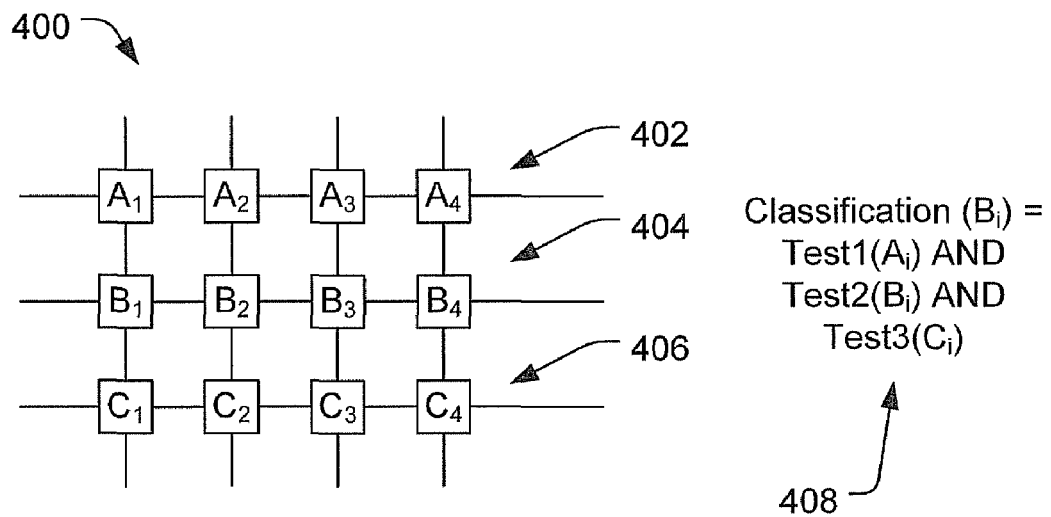
FIG. 4 is a diagram illustrating a particular embodiment of classifying whether individual cells of multiple addressed cells are prone to a disturb error.

FIG. 4 is a diagram illustrating a particular embodiment of classifying whether individual cells of multiple addressed cells are prone to a disturb error. A memory array 400 includes an addressed set of cells $B_1$-$B_4$ 404 coupled to a particular word line. The memory array 400 also includes a plurality of cells adjacent to the addressed set of cells $B_1$-$B_4$ 404, including a first set of neighbor cells $A_1$-$A_4$ 402 and a second set of neighbor cells $C_1$-$C_4$ 406.

The addressed set of cells $B_1$-$B_4$ 404 may be read during a read operation, and the states of the first set of neighbor cells $A_1$-$A_4$ 402 and the second set of neighbor cells $C_1$-$C_4$ 406 may be read for disturb error testing, such as by the control circuit 112 of FIG. 1 or the controller 206 of FIG. 2. A memory state of each cell of the addressed set of cells $B_1$-$B_4$ 404 may be associated with at least one corresponding cell of the first set of neighbor cells $A_1$-$A_4$ 402 or the second set of neighbor cells $C_1$-$C_4$ 406, or both.

For example, where disturb conditions are determined to only occur due to read or write operations at memory cells coupled to same bit line and adjacent word lines, $B_2$ may be associated with $A_2$ and $C_2$. As another example, where disturb conditions are determined to be possible due to read or write conditions at memory cells coupled to the same bit line and adjacent word lines, and at memory cells coupled to adjacent bit lines and the same word lines, $B_2$ may be associated with $A_2$, $C_2$, $B_1$, and $B_3$. As yet another example, where disturb conditions are determined to also be possible due to read or write operations at memory cells coupled to an adjacent word line and an adjacent bit line, $B_2$ may be associated with $A_1$, $A_2$, $A_3$, $B_1$, $B_3$, $C_1$, $C_2$, and $C_3$.

A vector 408 of classification values may be generated related to the classifications of each of the addressed set of cells $B_1$-$B_4$ 404. For example, where the joint states of $A_i$, $B_i$, and $C_i$ are sufficient to determine a probability of a disturb condition at $B_1$, (where i=1, 2, 3, 4 . . . ) a first test may be performed on the state of $A_i$, (Test1 ($A_i$)), a second test may be performed on the state of $B_i$ (Test2 ($B_i$)), and a third test may be performed on the state of $C_i$ (Test3 ($C_i$)). The corresponding value of the vector 408 (Classification($B_i$)) may indicate the satisfaction of all three tests, i.e., a logical one value indicating a potential disturb error at the particular cell when all three tests are satisfied, or a logical zero value indicating no potential disturb error when at least one test is not satisfied. The vector 408 can be used to indicate potential disturb errors in the readings of the addressed set of cells $B_1$-$B_4$ 404. For example, the vector 408 may be provided to the ECC decoder 244 via the reliability indicator 262 of FIG. 2.

In conjunction with the systems and explanations depicted and described with respect to FIGS. 1-4, in a particular embodiment, when estimating data that has been stored in a particular cell which is known to be sensitive to a program disturb, or to a read disturb, or both, or any other disturb on flash cells, the following can be performed:

a. A reading operation is performed on the particular cell, and a number of neighboring cells, whose values (e.g. threshold voltage) may be in correlation with a certain property of the particular cell, such as neighboring cells with high state.

b. The values read from each cell are associated with a state of the cell; for example in a sixteen level flash memory, each value is associated with one of sixteen states.

c. The joint states of a reading are determined as the states of the cell and its associated neighbors.

d. The set of all possible joint states of a reading operation can be partitioned into a number of classes, each of the classes associated with a different property. For example, the set of all possible joint states may be determined offline as patterns of a first class associated with a non-disturb event or of a second class associated with a disturb event, such as the first class 366 and the second class 368 of the set of patterns 360 of FIG. 3.

e. The data that is stored in the cell is estimated, as a function of the class of the joint states.

In another embodiment, the readings of the cells are done with a resolution that is higher than the resolution of the states:

a. A reading operation is performed on the cell, and a number of neighboring cells whose values may be in correlation with a certain property of the desired cell, such as neighboring cells with high state.

b. The set of all possible joint values of reading operation can be partitioned into a number of classes, each of the classes associated with a different property.

c. The data that is stored in the cell can be estimated as a function of the class of the joint values.

For example, an addressed cell may read together with two neighboring cells, such as neighboring cells on the same bit line but not the immediate nearest neighbors. This scenario may depend on the pattern formed on the bit line which creates the classes. The set of joint values (e.g. a vector of the three readings) is partitioned into two classes according to the property: (i) the class of values which are in correlation with a disturb event; and (ii) the class of values which are in correlation with a non-disturb event.

In other words, if a vector of joint readings belongs to class (i), then the desired cell has a high probability of being subject to a disturb event, and its value may have a high probability of requiring adjustment, and therefore should be adjusted, while if a vector of joint readings belongs to class (ii), then the desired cell has a low probability of being subject to a disturb event, and its value remains unmodified.

In a "soft" variation, in the first case a low reliability measure is associated with the desired cell reading as the read result less accurately represents the programmed state of the designated cell as a result of the association of the cell with the particular class. In the second case a higher reliability measure is associated with the desired cell reading, as this reading better represents the programmed state of the designated cell.

These reliability measures can then be employed to feed a soft input ECC decoder for which the decoding operation is improved upon better reliability estimates, thus its error correction capability is increased. Otherwise if the cells are not classified into groups, then the average reduced reliability estimates may be fed into all bits representing the data stored in the set of cells, which may affect a correction capability of a soft input ECC decoder.

A more detailed example may include:

a. Reading cells in a designated WL(n) of a multi-level cell (MLC) programmed device associating a reliability measure to each set of bits stored in each cell of WL(n) according to the read threshold voltage of each cell.

b. Reading a neighboring WL(n+j) such that j>0, then reading neighboring WL(n−k) such that k>0.

c. Computing a binary vector for WL(n+j) in which each cell in WL(n+j) has a corresponding binary value that represents a first logical function applied to the cell. For example, the logical function could be that the read threshold level in the cell is above three volts.

d. Computing a binary vector for WL(n−k) in which each cell in WL(n−k) has a corresponding binary value that represents a second logical function applied to the cell.

e. The first and second logical function may or may not be different. For example, the second logical function could be that the read threshold level in the cell is below one volt.

f. Computing a bit by bit AND operation on the two binary vectors, resulting in a flag vector being generated.

g. For each cell in WL(n) with associated "1" (e.g., a logical one value) in the flag vector, modifying the corresponding reliability measure for the cell.

h. Feeding an ECC decoder with the modified reliability measures.

i. Activating the ECC decoder to decode bits stored in cells of designated WL(n) using the modified reliability measures.

Another detailed example may include:

a. Reading cells in a designated WL(n) of a multi-level cell (MLC) programmed device associating a reliability measure to each set of bits stored in each cell of WL(n) according to the read threshold voltage of each cell.

b. Reading a neighboring WL(n+j) such that j>0 c. Computing a binary flag vector for WL(n+j) in which each cell in WL(n+j) has a corresponding binary value that represents a logical function applied to the cell. For example, the logical function could be that the read threshold level in the cell is above three volts.

g. For each cell in WL(n) with associated "1" (e.g., a logical one value) in the flag vector, modifying the corresponding reliability measure for the cell.

h. Feeding an ECC decoder with the modified reliability measures.

i. Activating the ECC decoder to decode bits stored in cells of designated WL(n) using the modified reliability measures.

Another example related to a single-level cell (SLC) system may include:

a. Reading cell in a designated WL(n) of a flash device programmed in an SLC scheme associating a reliability measure to each bit (stored separately in each cell) of WL(n) according to the read threshold voltage of each cell.

b. Computing a binary flag vector for WL(n+j) in which each cell in WL(n+j) has a corresponding binary value that represents a first logical function applied to each cell in WL(n+j). The logical function could be that the read threshold level in each cell is below five volts and above four volts.

c. For each cell in WL(n) with associated "1" in the flag vector, modifying a corresponding LLR reliability measure such that it is reduced by a factor of two.

d. Feeding an ECC decoder with modified reliability measures.

e. Activating the ECC decoder to decode bits stored in cells of designated WL(n) using the modified reliability measures.

As another example, a set of multiple desired cells and multiple neighboring cells may be read, and the joint reading may be partitioned into two or more classes, each class associated with a certain property of the multiple desired cells. The definition of the classes can either be performed as part of an offline process in which the flash memory device is analyzed and the correlations are studied.

For example, for a particular flash technology, in a particular embodiment, cells that are more prone to a program disturb may be identified by:

a. Performing a binary reading of WL(n−4) and identifying cells having a threshold voltage less than or equal to a first reference voltage. Denote the read binary page as P(n−4).

b. Performing a binary reading of WL(n+4) and identifying cells for which the threshold voltage is greater than or equal to a second reference voltage that is less than the first reference voltage. Denote the read binary page as P(n+4).

c. Generating P=P(n−4) AND P(n+4). Every cell corresponding to a "1" in P may be identified as a cell of WL(n) that is more prone to a program disturb. Every cell corresponding to a "0" in P may be identified as a cell of WL(n) that is less prone to a program disturb.

Figure 5:
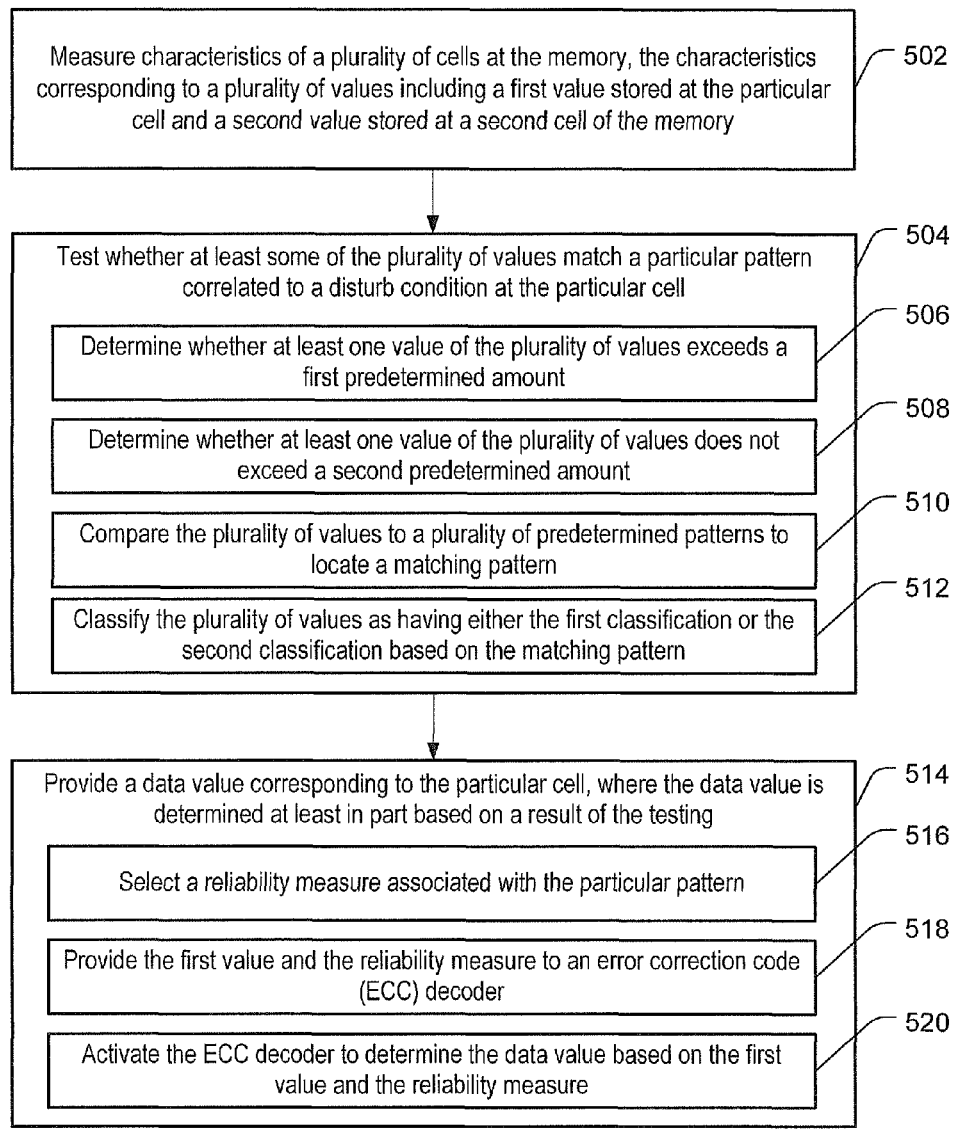
FIG. 5 is a flow diagram of a particular embodiment of a method of determining a data value stored at a particular cell of a memory.

FIG. 5 is a flow diagram of a particular embodiment of a method of determining a data value stored at a particular cell of a memory, such as a flash memory. In an illustrative embodiment, the method may be implemented at the memory device 102 of FIG. 1 or the memory device 202 of FIG. 2.

Characteristics are measured of a plurality of cells at the memory, the characteristics corresponding to a plurality of values including a first value stored at the particular cell and a second value stored at a second cell of the memory, at 502. For example, the characteristics may include a magnitude of a read current indicating a threshold voltage due to a level of charge at a floating gate of each cell of a plurality of cells. The first cell may be coupled to a particular bit line and to a particular word line, and the second cell may be coupled to the particular bit line and to a second word line. The plurality of values may also include a third value stored at a third cell of the memory. The third cell may also be coupled to the particular bit line and to a third word line such that the first word line is located between the second word line and the third word line.

Continuing to 504, testing whether at least some of the plurality of values match a particular pattern correlated to a disturb condition at the particular cell is performed. For example, the disturb condition may be a read disturb condition or a program disturb condition. The particular pattern may be empirically determined to indicate the disturb condition. For example, the particular pattern may be one of the read disturb patterns 250 or program disturb patterns 252 of FIG. 2. In an illustrative embodiment, the testing may be performed by a memory control element, such as the disturb error tester 114 of the control circuit 112 of FIG. 1 or the processor 240 of the controller 206 of FIG. 2, as illustrative, non-limiting examples.

The testing may identify a risk of the first value having the disturb condition without determining cross-coupling coefficients. For example, the disturb condition may indicate that a probability of an error in the first value due to a data write operation occurring at the second cell is greater than a predetermined probability. The predetermined probability may be at least partially based on a capability of an error correction circuit, such as the ECC decoder 244 of FIG. 2, to identify and correct erroneous values. For example, the predetermined probability may be set at one-half of one percent, one or two percent, five percent, ten percent, or twenty percent, or fifty percent, as illustrative, non-limiting examples.

The testing may include determining whether at least one value of the plurality of values exceeds a first predetermined amount, at 506. The testing may include determining whether at least one value of the plurality of values does not exceed a second predetermined amount, at 508.

The testing may include comparing the plurality of values to a plurality of predetermined patterns to locate a matching pattern, at 510. A first predetermined pattern of the plurality of predetermined patterns may correspond to a first classification that indicates the disturb condition, and a second predetermined pattern of the plurality of predetermined patterns may correspond to a second classification not indicating the disturb condition. The testing may also include classifying the plurality of values as having either the first classification or the second classification based on the matching pattern, at 512. In other embodiments, three or more predetermined patterns may be correlated with corresponding probabilities of the disturb condition. For example, the first predetermined pattern may correspond to a probability of a disturb error that is greater than a first threshold, the second predetermined pattern may correspond to a probability of a disturb error that is less than a second threshold, and a third predetermined pattern of the plurality of predetermined patterns may correspond to a probability of the disturb error that is not greater than the first threshold and not less than the second threshold. Therefore, the first predetermined pattern may correspond to a first classification, the second predetermined pattern may correspond to a second classification, and the third predetermined pattern may correspond to a third classification. Each predetermined pattern or classification may be associated with a corresponding reliability measure, such as the reliability measures r1-r4 of the set of reliability measures 382 of FIG. 3.

Advancing to 514, a data value corresponding to the particular cell is provided, where the data value is determined at least in part based on a result of the testing. For example, providing the data value may include selecting a reliability measure associated with the particular pattern, at 516, providing the first value and the reliability measure to an error correction code (ECC) decoder, at 518, and activating the ECC decoder to determine the data value based on the first value and the reliability measure, at 520.

Figure 6:
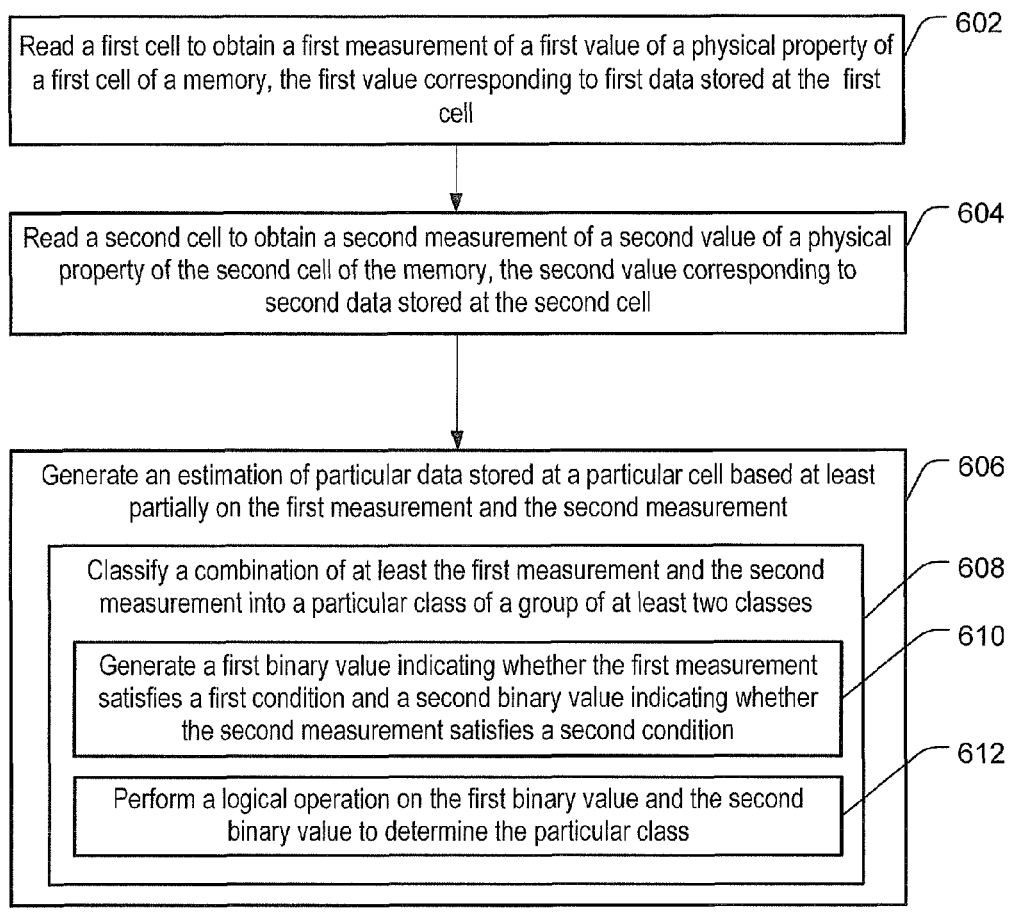
FIG. 6 is a flow diagram of a particular embodiment of a method of reading data stored at a particular cell of a memory.

FIG. 6 is a flow diagram of a particular embodiment of a method of reading data stored at a particular cell of a memory, such as a flash memory. In an illustrative embodiment, the method may be implemented at the memory device 102 of FIG. 1 or the memory device 202 of FIG. 2.

The method includes reading a first cell to obtain a first measurement of a first value of a physical property of a first cell of a memory, the first value corresponding to first data stored at the first cell, at 602. Moving to 604, a second cell is read to obtain a second measurement of a second value of a physical property of the second cell of the memory, the second value corresponding to second data stored at the second cell. In a particular embodiment, the first cell and the second cell are flash cells. The physical property of the first cell may be a threshold voltage of the first cell, and the physical property of the second cell may be a threshold voltage of the second cell.

Proceeding to 606, an estimation of particular data stored at a particular cell is generated based at least partially on the first measurement and the second measurement. Generating the estimation includes classifying a combination of at least the first measurement and the second measurement into a particular class of a group of at least two classes, at 608. At least one class of the group of at least two classes is a class of combination measurement values that are determined to correlate to the particular cell being prone to a disturb error. For example, the disturb error may include a programming-time disturb error or a read-time disturb error.

In a particular embodiment, the particular cell is the first cell. The second cell may be at a location within the memory relative to the particular cell such that a data write to the second cell can potentially disturb a value of a physical property of the particular cell. For example, the measurements of the second cell and the first cell may be determined to satisfy conditions correlated to the first cell being prone to a program disturb. In another embodiment, the first cell and the second cell are neighbor cells to the particular cell. For example, the first cell and the second cell may be at locations within the memory relative to the particular cell such that a data write to the first cell, the second cell, or both, can potentially disturb a value of a physical property of the particular cell. In yet another embodiment, the first cell and the second cell are neighboring cells to the particular cell, and the particular cell is read to obtain a third measurement of a third value of a physical property of the particular cell. The third measurement may also be included in the combination. Thus, in some embodiments, the classification may be determined based on measurements of the particular cell and one or more neighbor cells, while in other embodiments the classification may be determined based on measurements of one or more neighbor cells and not the particular cell. At least one of the neighbor cells may be coupled to the same bit line as the particular cell and to a different word line than the particular cell.

Classifying the combination of at least the first measurement and the second measurement may include generating a first binary value indicating whether the first measurement satisfies a first condition and a second binary value indicating whether the second measurement satisfies a second condition, at 610. The classifying may also include performing a logical operation on the first binary value and the second binary value to determine the particular class, at 612. In another embodiment, a vector may be generated that includes a first binary value that indicates whether the first measurement satisfies a first condition and a second binary value that indicates whether the second measurement satisfies a second condition. Each of four possible values of the vector may represent a corresponding class of four distinct classes, and each distinct class may be associated with a corresponding reliability measure. A particular reliability measure of the particular data may be determined based on a class represented by the vector, and the particular reliability measure may be provided to an error correction code (ECC) decoder.

Figure 7:
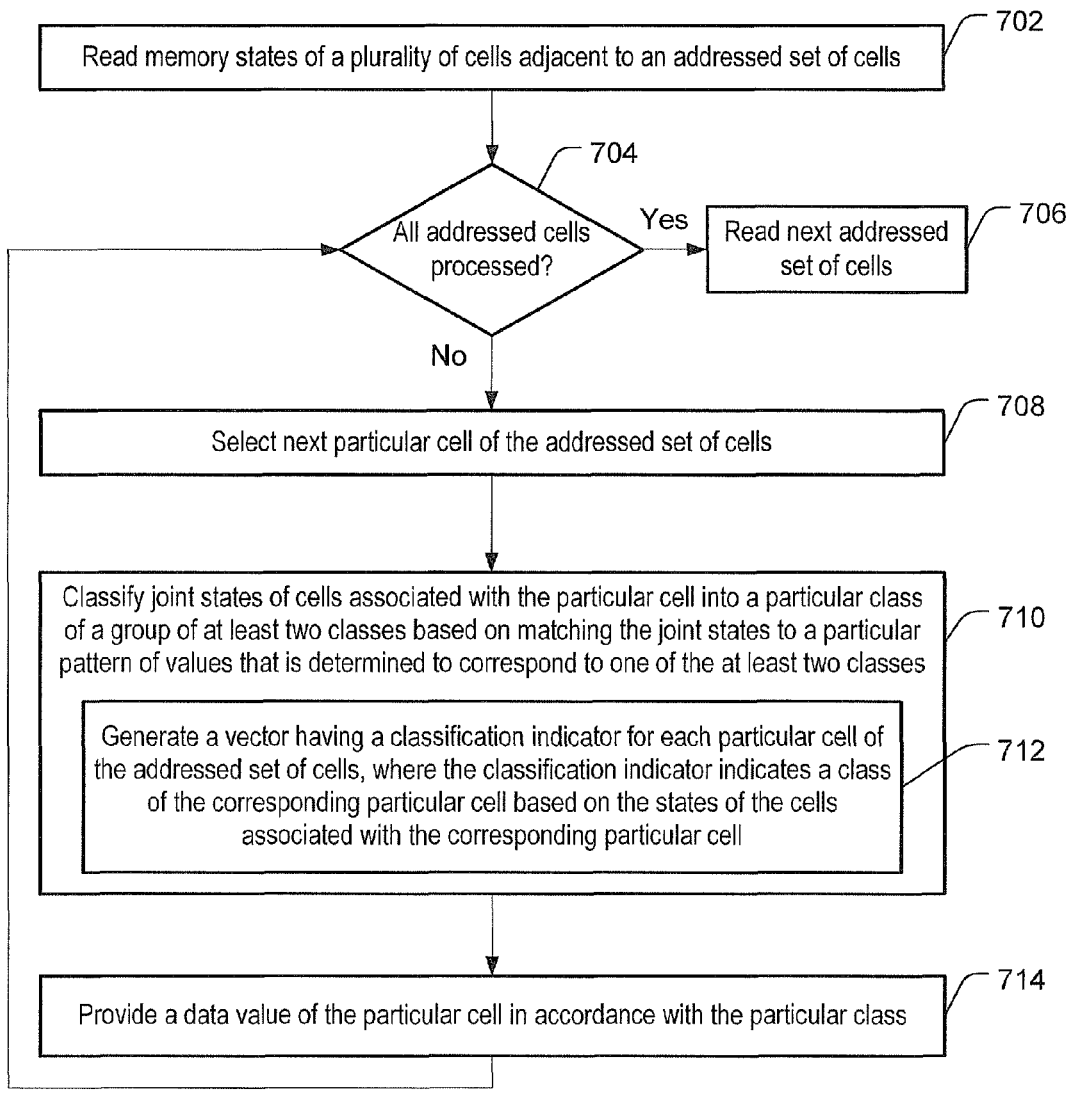
FIG. 7 is a flow diagram of a particular embodiment of a method of providing a data value of each cell of an addressed set of cells of a memory.

FIG. 7 is a flow diagram of a particular embodiment of a method of providing a data value of each cell of an addressed set of cells of a memory. In an illustrative embodiment, the method is performed in a flash device that includes an array of memory cells and a circuit to read states of multiple memory cells and to compare the read states to at least two reference voltage levels defining at least three memory state ranges.

Memory states of a plurality of cells adjacent to an addressed set of cells are read, at 702. A memory state of each cell of the addressed set of cells is associated with at least one corresponding cell of the plurality of cells. For example, the addressed set of cells may be the addressed set of cells 404 of FIG. 4, and the plurality of cells adjacent to the addressed set of cells may be first set of neighboring cells 402, the second set of neighboring cells 406, or any combination thereof.

Advancing to decision 704, a determination may be made whether all cells of the addressed set of cells has been processed. When all cells of the addressed set of cells have been processed, a next addressed set of cells may be read, at 706. Otherwise, a next particular cell of the addressed set of cells may be selected, at 708, until each particular cell of the addressed set of cells has been processed.

Moving to 710, joint states of cells associated with the particular cell are classified into a particular class of a group of at least two classes based on matching the joint states to a particular pattern of values that is determined to correspond to one of the at least two classes. At least one class of the group of at least two classes may indicate a correlation between the joint states of the cells associated with the particular cell and the particular cell being prone to a programming disturb, in one example, or a read disturb, in another example. The classifying may include generating a vector having a classification indicator for each particular cell of the addressed set of cells, where the classification indicator indicates a class of the corresponding particular cell based on the states of the cells associated with the corresponding particular cell, at 712. For example, where the group includes more than two classes, each classification indicator may be represented by an integer, a multi-bit binary number or binary vector, or other representation of three or more values. When the group does not include more than two classes, the classifying may instead include generating a vector having a binary value for each particular cell of the addressed set of cells, where the binary value indicates whether the states of the cells associated with the corresponding particular cell are classified under the first class.

Proceeding to 714, a data value of the particular cell may be provided in accordance with the particular class. For example, the data value may be based on the read memory state of the particular cell and further based on the particular class. To illustrate, when the particular class indicates the particular cell is prone to a disturb error, a further error detection and correction process may be implemented that is not implemented when the particular class indicates the particular cell is not prone to a disturb error. As a further example, when three or more classes are used, each of the values in the vector may be mapped to one of the classes which in turn may determine a reliability measure of the addressed cell, where each class represents a different reliability measure, or a different probability for the cell to be prone to a disturb event, than the other classes.

Figure 8:
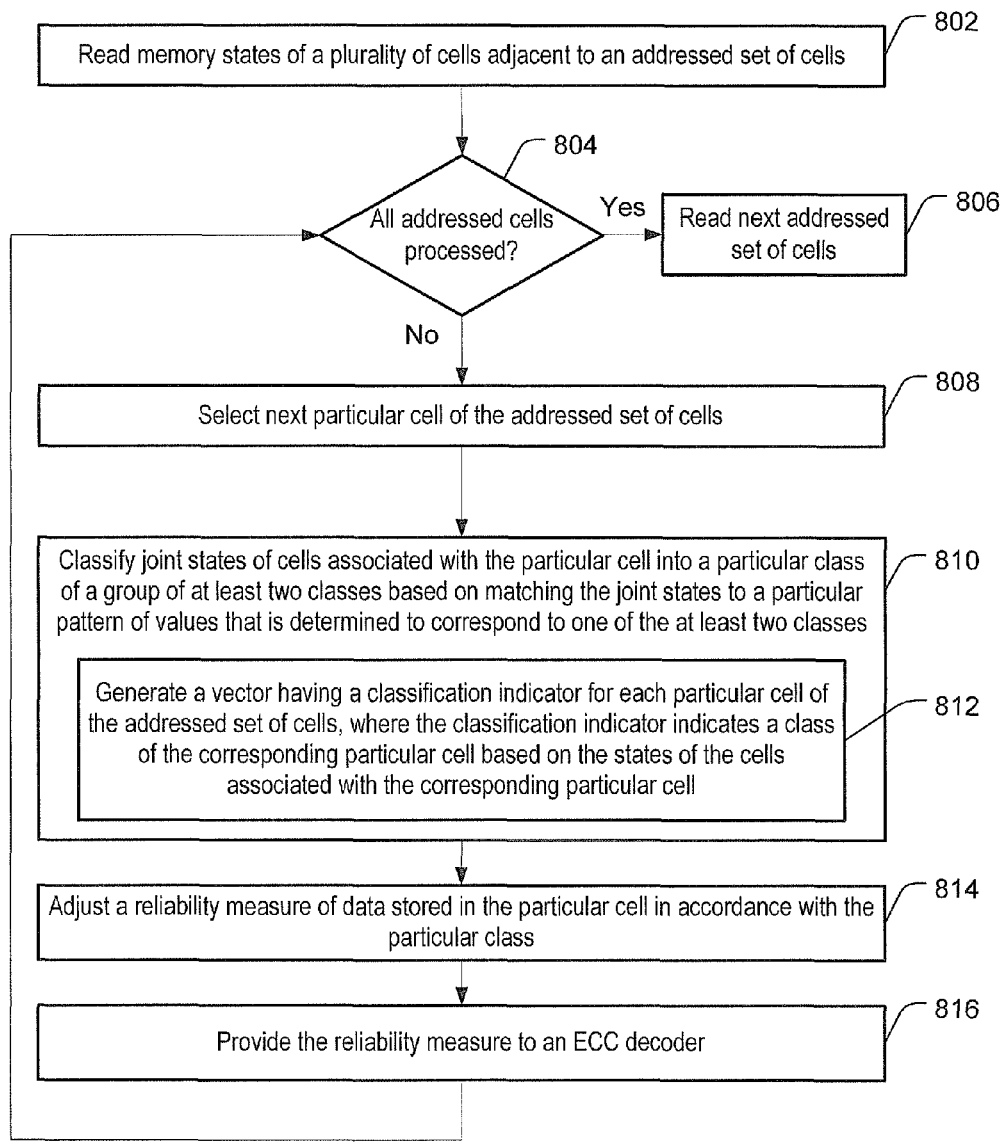
FIG. 8 is a flow diagram of a particular embodiment of a method of reading data of each cell of an addressed set of cells of a memory.

FIG. 8 is a flow diagram of a particular embodiment of a method of reading data of each cell of an addressed set of cells of a memory. In an illustrative embodiment, the method is performed in a flash device that includes an array of memory cells and a circuit to read states of multiple memory cells and to compare the read states to at least two reference voltage levels defining at least three memory state ranges.

Memory states of a plurality of cells adjacent to an addressed set of cells are read, at 802. A memory state of each cell of the addressed set of cells is associated with at least one corresponding cell of the plurality of cells. The plurality of cells may include at least two cells sharing a bit line with a corresponding cell of the addressed set of cells. For example, the addressed set of cells may be the addressed set of cells 404 of FIG. 4, and the plurality of cells adjacent to the addressed set of cells may be first set of neighboring cells 402, the second set of neighboring cells 406, or any combination thereof.

Advancing to decision 804, a determination may be made whether all cells of the addressed set of cells has been processed. When all cells of the addressed set of cells have been processed, a next addressed set of cells may be read, at 806. Otherwise, a next particular cell of the addressed set of cells may be selected, at 808, until each particular cell of the addressed set of cells has been processed.

Moving to 810, joint states of cells associated with the particular cell are classified into a particular class of a group of at least two classes based on matching the joint states to a particular pattern of values that is determined to correspond to one of the at least two classes. A first class of the group of at least two classes may indicate a correlation between the joint states of the cells associated with the particular cell and the particular cell being prone to a programming disturb, in one example, or a read disturb, in another example. The determined correlation may be empirically determined. The classifying may include generating a vector having a classification indicator for each particular cell of the addressed set of cells, where the classification indicator indicates a class of the corresponding particular cell based on the states of the cells associated with the corresponding particular cell, at 812. For example, where the group includes more than two classes, each classification indicator may be represented by an integer, a multi-bit binary number or binary vector, or other representation of three or more values. When the group does not include more than two classes, the classifying may instead include generating a vector having a binary value for each particular cell of the addressed set of cells, where the binary value indicates whether the states of the cells associated with the corresponding particular cell are classified under the first class.

Proceeding to 814, a reliability measure of data stored in the particular cell may be adjusted in accordance with the particular class. For example, when three or more classes are used, each of the values in the vector may be mapped to one of the classes which in turn may determine a reliability measure of the addressed cell, where each class may represent a different reliability measure than the other classes. Continuing to 816, the reliability measure may be provided to an error correction code (ECC) decoder. For example, the reliability measure may be provided as the reliability indicator 262 that is provided to the ECC decoder 244 of FIG. 2.

Although various components depicted herein are illustrated as block components and described in general terms, such components may include one or more microprocessors, state machines, or other circuits configured to enable the memory device 102 of FIG. 1 or the memory device 202 of FIG. 2 to perform the particular functions attributed to such components, or any combination thereof. For example, the control circuit 112, the disturb error tester 114, or both, of FIG. 1 may represent physical components, such as controllers, state machines, logic circuits, or other structures to enable the memory device 102 to receive and respond to data requests from a host device or from other external devices to access and process data by testing for a disturb error in data read from the memory array 104.

For example, the disturb error tester 114 of FIG. 1 may be implemented using a microprocessor or microcontroller programmed to compare combinations of values read from neighboring cells to predetermined combinations known to be correlated to a disturb condition at an addressed cell. In a particular embodiment, the disturb error tester 114 of FIG. 1 includes executable instructions that are executed by a processor and the instructions are stored at the memory array 104. Alternatively, or in addition, executable instructions that are executed by the processor included in the disturb error tester 114 of FIG. 1 may be stored at a separate memory location that is not part of the memory array 104, such as at a read-only memory (ROM) (not shown).

In a particular embodiment, the memory device 102 may be a portable device configured to be selectively coupled to one or more external devices. However, in other embodiments, the memory device may be attached or embedded within one or more host devices, such as within a housing of a portable communication device. For example, the storage device may be within a packaged apparatus such as a wireless telephone, personal digital assistant (PDA), gaming device or console, portable navigation device, or other device that uses internal non-volatile memory. In a particular embodiment, the memory device 102 is a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. Accordingly, the disclosure and the figures are to be regarded as illustrative rather than restrictive.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A storage device comprising:
   a plurality of memory elements; and
   a controller, the controller configured to:
   receive measured characteristics of the memory elements, the characteristics corresponding to a plurality of values including a first value stored at a first memory element of the plurality of memory elements and a second value stored at a second memory element of the plurality of memory elements;
   test whether at least some of the plurality of values match a particular pattern correlated to a disturb condition at the first memory element; and
   provide a data value corresponding to the first memory element, wherein the data value is determined at least in part based on a result of the test.

2. The storage device of claim 1, wherein the disturb condition is a read disturb condition.

3. The storage device of claim 1, wherein the disturb condition is a program disturb condition.

4. The storage device of claim 1, wherein the disturb condition indicates that a probability of an error in the first value due to a data write operation occurring at the second memory element is greater than a predetermined probability.

5. The storage device of claim 1, wherein the test includes:
   comparing the plurality of values to a plurality of predetermined patterns to locate a matching pattern, wherein at least a first predetermined pattern of the plurality of predetermined patterns corresponds to a first classification that indicates the disturb condition, and wherein at least a second predetermined pattern of the plurality of predetermined patterns corresponds to a second classification not indicating the disturb condition; and
   classifying the plurality of values as having one of the first classification and the second classification based on the matching pattern.

6. The storage device of claim 1, wherein the test includes a determination of whether at least one value of the plurality of values exceeds a first predetermined amount.

7. A memory storage device comprising:
   a plurality of memory elements; and
   a controller configured to:
   receive a first value corresponding to first data stored at a first memory element of the plurality of memory elements;
   receive a second value corresponding to second data stored at a second memory element of the plurality of memory elements; and
   generate an estimation of particular data stored at a particular memory element of the plurality of memory elements based at least partially on the first value and the second value, wherein the estimation is generated by classifying a combination of at least the first value and the second value into a particular class of a group of at least two classes, wherein at least one class of the group indicates that the particular memory element is prone to a disturb error.

8. The memory storage device of claim 7, wherein the first memory element and the second memory element are flash memory elements, and wherein the first value corresponds to a first threshold voltage of the first memory element, and wherein the second value corresponds to a second threshold voltage of the second memory element.

9. The memory storage device of claim 7, wherein classifying the combination of at least the first value and the second value includes generating a first binary indicator indicating whether the first value satisfies a first condition and a second binary indicator indicating whether the second value satisfies a second condition.

10. The memory storage device of claim 9, further comprising performing a logical operation on the first binary indicator and the second binary indicator to determine the particular class.

11. The memory storage device of claim 7, wherein classifying the combination of at least the first value and the second value includes generating a vector including a first binary indicator that indicates whether the first value satisfies a first condition and a second binary indicator that indicates whether the second value satisfies a second condition, wherein each of four possible values of the vector represents a corresponding class and wherein each class is distinct and is associated with a corresponding reliability measure.

12. The memory storage device of claim 11, further comprising determining a particular reliability measure of the particular data based on the corresponding class represented by the vector.

13. The memory storage device of claim 12, further comprising providing the particular reliability measure to an error correction code (ECC) decoder.

14. A non-volatile memory device comprising:
   memory elements;
   a read circuit configured to read memory states of a first plurality of the memory elements, wherein each of the first plurality of the memory elements is adjacent to addressed memory elements of the memory elements, wherein a memory state of each addressed memory element is associated with at least one corresponding memory element of the first plurality of the memory elements; and
   a controller configured to, for each particular addressed memory element:
   classify joint states comprising states of those memory elements of the first plurality of memory elements that are associated with the particular addressed memory element into a particular class of at least two classes by matching the joint states to a particular pattern of values corresponding to the particular class, wherein one of the at least two classes is associated with a correlation of the particular addressed memory element to a disturb error; and
   provide a data value of the particular addressed memory element in accordance with the particular class.

15. The non-volatile memory device of claim 14, wherein the disturb error corresponds to a programming disturb.

16. The non-volatile memory device of claim 14, wherein the disturb error corresponds to a read disturb.

17. A data storage device comprising:
   memory elements;
   a read circuit configured to read memory states of each memory element of a group of the memory elements, wherein each memory element of the group of the memory elements is adjacent to a particular memory element that is addressed and wherein a memory state of the particular memory element is associated with each memory element of the group of the memory elements; and
   a controller configured to, for the particular memory element:
   classify joint states of the memory elements of the group of memory elements into a particular class of at least two classes, wherein a first class of the at least two classes indicates a correlation between the particular memory element and a disturb condition; and adjust a reliability measure associated with data stored in the particular memory element in accordance with the particular class.

18. The data storage device of claim 17, wherein the correlation is empirically determined.

19. The data storage device of claim 17, wherein the group of the memory elements includes at least two memory elements that share a bit line with the particular memory element.

20. The data storage device of claim 17, wherein the controller is further configured to provide the reliability measure to an error correction code (ECC) decoder.

* * * * *